(12) United States Patent
Stokhof et al.

(10) Patent No.: US 8,652,573 B2
(45) Date of Patent: Feb. 18, 2014

(54) METHOD OF CVD-DEPOSITING A FILM HAVING A SUBSTANTIALLY UNIFORM FILM THICKNESS

(75) Inventors: Maarten Stokhof, Almere (NL); Hessel Sprey, Almere (NL); Tatsuya Yoshimi, Almere (NL); Bert Jongbloed, Almere (NL); Noureddine Adjeroud, Almere (NL)

(73) Assignee: ASM International N.V., Almere (NL)

( * ) Notice: Subject to any disclaimer, the term of this patent is extended or adjusted under 35 U.S.C. 154(b) by 241 days.

(21) Appl. No.: 13/183,016

(22) Filed: Jul. 14, 2011

(65) Prior Publication Data

US 2012/0015105 A1    Jan. 19, 2012

Related U.S. Application Data

(60) Provisional application No. 61/364,415, filed on Jul. 15, 2010.

(51) Int. Cl.
*C23C 16/00* (2006.01)
*C23C 16/08* (2006.01)

(52) U.S. Cl.
USPC ............ 427/248.1; 427/255.28; 427/255.391; 427/255.394

(58) Field of Classification Search
USPC ............ 427/248.1, 255.28, 255.391, 255.394
See application file for complete search history.

(56) References Cited

U.S. PATENT DOCUMENTS

| | | | |
|---|---|---|---|
| 5,279,857 A * | 1/1994 | Eichman et al. | 427/255.11 |
| 5,344,792 A * | 9/1994 | Sandhu et al. | 438/660 |
| 7,517,800 B2 | 4/2009 | Okudaira et al. | |
| 2003/0134038 A1 | 7/2003 | Paranjpe | |
| 2004/0151845 A1 * | 8/2004 | Nguyen et al. | 427/569 |
| 2006/0060137 A1 | 3/2006 | Hasper et al. | |
| 2006/0292864 A1 * | 12/2006 | Yang et al. | 438/653 |
| 2007/0077775 A1 * | 4/2007 | Hasper et al. | 438/758 |
| 2007/0141812 A1 | 6/2007 | Zagwijn et al. | |
| 2008/0206982 A1 * | 8/2008 | Suzuki | 438/627 |
| 2008/0317972 A1 * | 12/2008 | Hendriks et al. | 427/569 |
| 2010/0003406 A1 * | 1/2010 | Lam et al. | 427/255.391 |
| 2010/0297846 A1 | 11/2010 | Kaga et al. | |
| 2011/0206862 A1 * | 8/2011 | Gatineau et al. | 427/569 |
| 2012/0056326 A1 * | 3/2012 | Kraus et al. | 257/751 |

OTHER PUBLICATIONS

Zagwijn, Peter, et al., "Novel Batch Titanium Nitride CVD Process for Advanced Metal Electrodes". ECS Transactions, 13 (1) 459-464 (2008).*

* cited by examiner

*Primary Examiner* — Bret Chen
(74) *Attorney, Agent, or Firm* — Preti Flaherty Beliveau & Pachios LLP

(57) ABSTRACT

Method of depositing a film having a substantially uniform thickness by means of chemical vapor deposition, comprising:
  providing a reaction chamber;
  providing a substrate in said reaction chamber;
  subjecting the substrate to a series of deposition cycles, wherein each deposition cycle includes the steps of:
    (a) during a first time interval, supplying a first reactant to the reaction chamber;
    (b) during a second time interval, supplying a second reactant to the reaction chamber; and
    (c) during a third time interval, supplying neither the first nor the second reactant to the reaction chamber;
wherein a start of the second time interval lies within the first time interval, such that a pre-exposure interval exists between a start of the first time interval and the start of the second time interval, during which pre-exposure interval the first reactant is supplied to the reaction chamber while the second reactant is not.

27 Claims, 1 Drawing Sheet

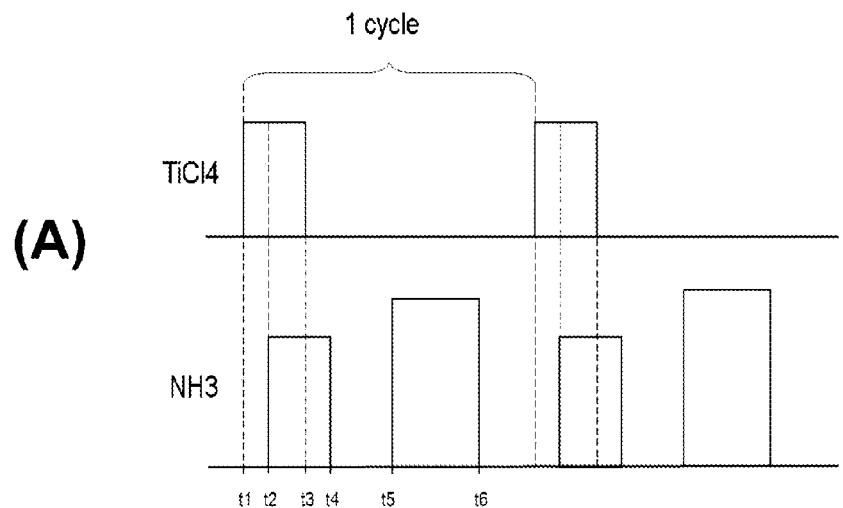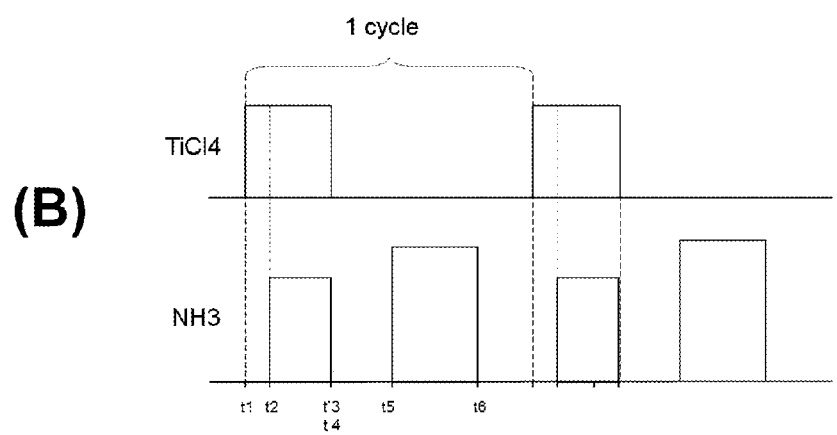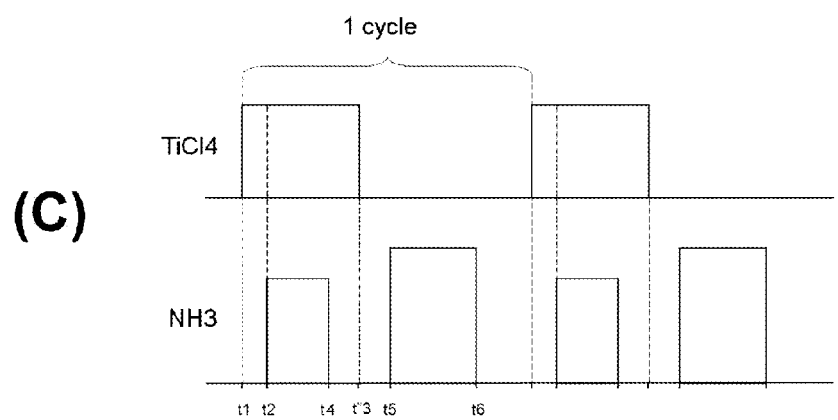

METHOD OF CVD-DEPOSITING A FILM HAVING A SUBSTANTIALLY UNIFORM FILM THICKNESS

FIELD OF THE INVENTION

The present invention relates to a method of depositing a film using chemical vapor deposition (CVD).

BACKGROUND

Film thickness uniformity is an important parameter that may affect a film's structural and functional characteristics. In conventional CVD-applications, the film thickness of a deposited film is primarily controlled by selecting the deposition time, whereas the uniformity of the film thickness across the deposited film may be controlled via process parameters, including, for example, process pressure and reactant flux homogeneity. In particular compared to layer-by-layer deposition techniques such as atomic layer deposition, control over film thickness uniformity in CVD-applications is rather cumbersome.

It is an object of the present invention to provide for a CVD-film deposition method wherein the film thickness uniformity is at least partly controlled in an alternative manner, and that facilitates the manufacture of a film having a substantially uniform film thickness.

SUMMARY OF THE INVENTION

One aspect of the present invention is directed to a method of depositing a film having a substantially uniform film thickness by means of chemical vapor deposition (CVD). The method comprises providing a reaction chamber, and providing a substrate in said reaction chamber. The method further comprises subjecting the substrate to a series of deposition cycles. Each deposition cycle includes the steps of (a) during a first time interval, supplying a first reactant to the reaction chamber, (b) during a second time interval, supplying a second reactant to the reaction chamber, and (c) during a third time interval, supplying neither the first nor the second reactant to the reaction chamber. A start of the second time interval lies within the first time interval, such that a pre-exposure interval exists between a start of the first time interval and the start of the second time interval, during which pre-exposure interval the first reactant is supplied to the reaction chamber while the second reactant is not supplied to the reaction chamber.

The method according to the present invention finds basis in experiments, which have surprisingly revealed that a pulsed CVD-treatment wherein the substrate is first exposed to a first reactant/precursor, and directly thereafter simultaneously exposed to both the first reactant and a second reactant/precursor so as to perform the actual CVD, may yield a deposited film with an excellent film uniformity that is better than that obtained without pre-exposure of the substrate to the first reactant.

The experiments were concerned with the pulsed CVD of a titanium nitride (TiN) film on a silicon substrate, wherein the film was applied using two gaseous reactants: titanium tetrachloride ($TiCl_4$) as the first reactant, and ammonia ($NH_3$) as the second reactant. In reference experiments, wherein no pre-exposure of the substrate to titanium tetrachloride took place, the average film uniformity was determined to be about 10%. In experiments wherein a film was deposited using the method according to the present invention, film uniformities as low as 1% were recorded. So, the invention may result in a ten times improved film thickness uniformity. Although the experiments were carried out with the specific reactants mentioned, it is conjectured that similar results may be obtained for different reactants. In a generalization, a metal halide may be taken as the first reactant, whereas a nitrogen comprising compound may be taken as the second reactant.

It is understood that the method according to the present invention features two pivotal steps: the pre-exposure of the substrate to the first reactant, and the subsequent CVD-step during which the first reactant is supplied to the reaction chamber together with a second reactant. These steps are not to be marginalized, neither in time, nor in terms of the amount of reactants that are supplied to the reaction chamber.

This is in contrast to, for example, the teaching of US 2003/0134038 A1 (Paranjpe). US '038 discloses a method of increasing the wafer throughput in an atomic layer processing (ALP) process. Compared to conventional ALP processes, the disclosed method entails eliminating discrete inert gas purging or evacuation steps between pulses of different reactants, which steps have no process benefit and only serve to isolate the reactants from each other in the reaction chamber. Instead, the reactant flows and pressures are cyclically modulated from one reactant directly to another. In one embodiment, a method cycle may successively include (i) injecting a first reactant into a reaction chamber, (ii) reducing the first reactant flow to an arbitrarily low value, (iii) injecting a second reactant into the reaction chamber for a second period of time. Instead of completely stopping the flow of the second reactant at the end of the second period, the flow rate of the second reactant may also be reduced to an arbitrarily low value, like that of the first reactant.

US '038 is based on the understanding that a small residual level of one reactant in the reaction chamber at the time the other reactant is injected may be tolerable during an ALP process. In case the residual level would become too large, however, significant parasitic CVD might occur, which is generally undesirable since it might detrimentally affect the properties of the ALP process. As US '308 is directed to a method for ALP, reducing the flow rates of one reactant before injecting another is key. In the method according to the present invention, which is directed to CVD, such reduction of the reactant flow rate is undesirable: a pre-exposure of the substrate to the first reactant is to be followed by a full exposure of the substrate to both the first and the second reactant. To be effective, preferably neither of the first and second reactant flows is reduced to a marginal level during the first or second time intervals. Practically, the average mass flow rate at which the first reactant is supplied to the reaction chamber during the first time interval may preferably be at least 50%, and more preferably at least 75%, of the average mass flow rate at which the first reactant is supplied to the reaction chamber during the second time interval.

A further difference between US '038 and the method according to the present invention is that a deposition cycle according to the present invention features a third time interval. This third time interval, which naturally follows (or precedes) both the first and second time intervals, may ensure that, at the start of the first time interval of the next deposition cycle (i.e. at the start of the next pre-exposure pulse), the reaction chamber is free of reactants, in particular the second reactant. To this end, the method may include at least one of, during the third time interval, (i) purging the reaction chamber with an inert gas and (ii) evacuating the reaction chamber. The third time interval may additionally be used for carrying out a non-deposition substrate treatment, such as, for example, an anneal step.

The start of the second time interval lies within the first time interval. The end of the second time interval, on the other hand, may (i) occur after the end of the first time interval, (ii) coincide with the end of the first time interval, or (iii) occur before the end of the first time interval. It is currently believed that the first option (i) provides for the best results in terms of film uniformity.

The duration of the pre-exposure of the substrate to the first reactant, i.e. the duration of the time interval between the start of the first time interval and the start of the second time interval, may preferably be at least 1 second, more preferably at least 3 seconds, and most preferably at least 10 seconds, so as to allow the first reactant to act exclusively (i.e. without any other reactant being present) on the substrate. The (partial) pressure of the first reactant in the reaction chamber during the pre-exposure interval may preferably be at least 10 mTorr, more preferably at least 25 mTorr, and most preferably at least 50 mTorr.

The duration of the actual chemical vapor deposition, i.e. the duration of the time interval during which the substrate is exposed to both the first and the second reactant, may preferably be at least 1 seconds, more preferably at least 3 seconds, and most preferably at least 10 seconds, so as to allow for the deposition of a sufficiently thick film.

These and other features and advantages of the invention will be more fully understood from the following detailed description of certain embodiments of the invention, taken together with the accompanying drawings, which are meant to illustrate and not to limit the invention.

BRIEF DESCRIPTION OF THE FIGURES

FIGS. 1A-C schematically depict three different flow variations for a first reactant (upper graph) and a second reactant (lower graph) as a function of time, each variation relating to an exemplary embodiment of the present invention.

DETAILED DESCRIPTION

FIGS. 1A-C schematically depict three flow variations of reactants as a function of time, each of which variations may be used in combination with the present invention. In the upper graph of each FIGURE, the flow of the first reactant (here: titanium tetrachloride; $TiCl_4$) is shown, whereas the lower graph depicts the flow of the second reactant (here: ammonia; $NH_3$).

The length of one deposition cycle is depicted in the FIGURES. Each cycle includes a first time interval, running from t1 to t3 (FIG. 1A), t'3 (FIG. 1B) or t"3 (FIG. 1C), during which the first reactant is supplied to the reaction chamber. Each cycle also includes a second time interval, running from t2 to t4, during which the second reactant is supplied to the reaction chamber. In addition, each cycle includes a third time interval, running from t4 to t5 (FIGS. 1A, 1B) or t"3 to t5 (FIG. 1C), during which neither the first nor the second reactant is supplied to the reaction chamber. Following the third time interval, there is an optional second reactant pulse, here in the form of an $NH_3$ flush that corresponds to a nitridation/anneal step, which again may be followed by a purge pulse or evacuation step. It has been found that the $NH_3$ flush step reduces the chlorine content and improves the quality of the deposited film.

It will be clear that the three flow variations of FIGS. 1A-C differ in the duration of the first time interval, and more in particular in the point in time t3, t'3, t"3 at which the first time interval ends. Consequently, the duration of the period during which both reactants are simultaneously supplied to the reaction chamber (i.e. the smaller one of t4 and t3, minus t2) and CVD is to take place differs. The duration of the titanium tetrachloride ($TiCl_4$) pre-exposure pulse, which runs from t1 to t2, is the same for all three depicted flow variations.

Alternatively, in the embodiments of FIGS. 1A and 1B the duration of the $NH_3$ flow interval (from t2 to t4) may be extended so that the $NH_3$ flush is incorporated into the second time interval and no time is lost to a separate intermediate purge step. The $NH_3$ flow may be kept at a constant level from t2 to t4, or the $NH_3$ flow may be maintained at a first level from t2 to t3 (FIG. 1A)/from t2 to t3' (FIG. 1B) and increased to a second, higher level from t3 to t4 (FIG. 1A)/from t3' to t4 (FIG. 1B).

The experiments that led to the present invention were carried out in an A412 vertical batch furnace for 300 mm wafer processing of ASM International N.V. of Almere, The Netherlands. During one of the experiments a deposition cycle in accordance with the flow variation pattern of FIG. 1B was used in combination with the following flow characteristics:

TABLE 1

Exemplary deposition cycle according to flow variation of FIG. 1B.

| | $TiCl_4$ (slm) | $NH_3$ (slm) | $N_2$ (slm) | pressure (mTorr) | temperature (° C.) | interval time (s) |
|---|---|---|---|---|---|---|
| $TiCl_4$ | 0.148 | 0.000 | 0.420 | 130.0 | 400-600 | 27 |
| $TiCl_4 + NH_3$ | 0.148 | 0.190 | 0.520 | 130.0 | 400-600 | 28 |
| $N_2$-purge | 0.000 | 0.000 | 0.420 | 130.0 | 400-600 | 30 |
| $NH_3$-flush | 0.000 | 1.000 | 0.320 | 130.0 | 400-600 | 120 |
| $N_2$-purge | 0.000 | 0.000 | 0.420 | 130.0 | 400-600 | 20 |

The data in Table 1, in combination with FIG. 1B, reflect the following process. During a first time interval, having a duration of 55 (=27+28) seconds, the first reactant titanium tetrachloride ($TiCl_4$) is supplied to the reaction chamber at a volumetric flow rate of 0.148 standard liters per minute (slm; 273K, 1.013 bar). At 27 seconds after the start of the first time interval, a second time interval, having a duration of 28 seconds starts. During the second time interval, the second reactant ammonia ($NH_3$) is supplied to the reaction chamber at a volumetric flow rate of 0.190 slm (together with the titanium tetrachloride), such that CVD takes place and a titanium nitride (TiN) film is deposited on the substrate. At 55 seconds after the start of the first time interval, both the first and second time intervals end; i.e. both the first and second reactant flows are stopped. The reaction chamber is then purged with nitrogen ($N_2$) for 30 seconds, followed by an ammonia-flush of 120 seconds, and another nitrogen purge pulse of 20 seconds.

During the entire deposition cycle, a nitrogen ($N_2$) gas flow, having a volumetric flow rate in the range of 0.320-0.520 slm, is maintained through the reaction chamber, while the pressure therein is kept approximately constant at 130.0 mTorr (17.33 Pa). The temperature of the substrate is maintained in the range of 400-600° C.

The film thickness uniformity of the deposited titanium nitride film—i.e the relative standard deviation of a population of thickness measurements sampled at locations across the substrate—showed a value of about 1%. This is markedly lower than the film thickness uniformity obtained for TiN-films that were deposited using a method wherein the first and second reactants were simultaneously switched on, i.e. without the 27-second pre-exposure of the substrate to $TiCl_4$ while keeping the other conditions the same.

Although illustrative embodiments of the present invention have been described above, in part with reference to the accompanying drawings, it is to be understood that the invention is not limited to these embodiments. E.g. the method may be carried out in a single wafer reactor having a much smaller volume than a vertical furnace batch reactor. This would allow the use of substantially shorter interval times than the interval times given in table 1. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases in "one embodiment" or in "an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

We claim:

1. A method of depositing a film having a substantially uniform thickness by means of chemical vapor deposition (CVD), comprising:
    providing a reaction chamber;
    providing a substrate in said reaction chamber;
    subjecting the substrate to a series of deposition cycles, wherein each deposition cycle includes the steps of:
        (a) during a first time interval, supplying a first reactant to the reaction chamber;
        (b) during a second time interval, supplying a second reactant to the reaction chamber; and
        (c) during a third time interval, supplying neither the first nor the second reactant to the reaction chamber;
    wherein a start of the second time interval lies within the first time interval, such that a pre-exposure interval exists between a start of the first time interval and the start of the second time interval, during which pre-exposure interval the first reactant is supplied to the reaction chamber while the second reactant is not supplied to the reaction chamber, and
        wherein an end of the second time interval either coincides with the end of the first time interval or occurs after the end of the first time interval.

2. The method according to claim 1, wherein an end of the second time interval occurs after an end of the first time interval.

3. The method according to claim 2, wherein:
    the second time interval starts no earlier than 1 second after a start of the first time interval;
    neither the first nor the second time interval ends earlier than 1 second after the start of the second time interval;
    the first reactant is titanium tetrachloride ($TiCl_4$);
    the second reactant is ammonia ($NH_3$);
    the average mass flow rate at which the first reactant is supplied to the reaction chamber during the first time interval is at least 50% of the average mass flow rate at which the first reactant is supplied to the reaction chamber during the second time interval;
    at least during the first and second time interval, a pressure in the reaction chamber is in the range of 50-300 mTorr;
    during the pre-exposure interval, the partial pressure of the first reactant in the reaction chamber is at least 10 mTorr;
    the temperature of the substrate is in the range of 400-600° C.;
    the third time interval includes at least one of:
        purging the reaction chamber with an inert gas; and
        evacuating the reaction chamber;
    the deposition cycle further includes a substrate surface anneal step in an ammonia ($NH_3$) environment; and
    the film thickness uniformity across a surface of the deposited film is less than 5%.

4. The method according to claim 1, wherein an end of the second time interval substantially coincides with an end of the first time interval.

5. The method according to claim 4, wherein:
    the second time interval starts no earlier than 1 second after a start of the first time interval;
    neither the first nor the second time interval ends earlier than 1 second after the start of the second time interval;
    the first reactant is titanium tetrachloride ($TiCl_4$);
    the second reactant is ammonia ($NH_3$);
    the average mass flow rate at which the first reactant is supplied to the reaction chamber during the first time interval is at least 50% of the average mass flow rate at which the first reactant is supplied to the reaction chamber during the second time interval;
    at least during the first and second time interval, a pressure in the reaction chamber is in the range of 50-300 mTorr;
    during the pre-exposure interval, the partial pressure of the first reactant in the reaction chamber is at least 10 mTorr;
    the temperature of the substrate is in the range of 400-600° C.;
    the third time interval includes at least one of:
        purging the reaction chamber with an inert gas; and
        evacuating the reaction chamber;
    the deposition cycle further includes a substrate surface anneal step in an ammonia ($NH_3$) environment; and
    the film thickness uniformity across a surface of the deposited film is less than 5%.

6. The method according to claim 1, wherein an end of the second time interval occurs before an end of the first time interval.

7. The method according to claim 6, wherein:
    the second time interval starts no earlier than 1 second after a start of the first time interval;
    neither the first nor the second time interval ends earlier than 1 second after the start of the second time interval;
    the first reactant is titanium tetrachloride ($TiCl_4$);
    the second reactant is ammonia ($NH_3$);
    the average mass flow rate at which the first reactant is supplied to the reaction chamber during the first time interval is at least 50% of the average mass flow rate at which the first reactant is supplied to the reaction chamber during the second time interval;
    at least during the first and second time interval, a pressure in the reaction chamber is in the range of 50-300 mTorr;
    during the pre-exposure interval, the partial pressure of the first reactant in the reaction chamber is at least 10 mTorr;
    the temperature of the substrate is in the range of 400-600° C.;
    the third time interval includes at least one of:
        purging the reaction chamber with an inert gas; and
        evacuating the reaction chamber;
    the deposition cycle further includes a substrate surface anneal step in an ammonia ($NH_3$) environment; and
    the film thickness uniformity across a surface of the deposited film is less than 5%.

8. The method according to claim 1, wherein the second time interval starts no earlier than 1 second after a start of the first time interval.

9. The method according to claim 1, wherein neither the first nor the second time interval ends earlier than 1 second, after the start of the second time interval.

10. The method according to claim 1, wherein the first reactant is a metal halide.

11. The method according to claim 10, wherein the first reactant is titanium tetrachloride ($TiCl_4$).

12. The method according to claim 1, wherein the second reactant is a nitrogen comprising compound.

13. The method according to claim 12, wherein the second reactant is ammonia ($NH_3$).

14. The method according to claim 1, wherein the average mass flow rate at which the first reactant is supplied to the reaction chamber during the first time interval is at least 50% of the average mass flow rate at which the first reactant is supplied to the reaction chamber during the second time interval.

15. The method according to claim 1, wherein, at least during the first and second time interval, a pressure in the reaction chamber is in the range of 50-300 mTorr.

16. The method according to claim 1, wherein, during the pre-exposure interval, the partial pressure of the first reactant in the reaction chamber is at least 10 mTorr.

17. The method according to claim 1, wherein the temperature of the substrate is in the range of 400-600° C.

18. The method according to claim 1, wherein the third time interval includes at least one of:
purging the reaction chamber with an inert gas; and
evacuating the reaction chamber.

19. The method according to claim 1, wherein the deposition cycle further includes a substrate surface anneal step in an ammonia ($NH_3$) environment.

20. The method according to claim 1, wherein the film thickness uniformity across a surface of the deposited film is less than 5%.

21. The method according to claim 1, wherein the second time interval starts no earlier than 3 seconds after a start of the first time interval.

22. The method according to claim 1, wherein neither the first nor the second time interval ends earlier than 3 seconds after the start of the second time interval.

23. The method according to claim 1, wherein the average mass flow rate at which the first reactant is supplied to the reaction chamber during the first time interval is at least 75% of the average mass flow rate at which the first reactant is supplied to the reaction chamber during the second time interval.

24. The method according to claim 1, wherein, at least during the first and second time interval, a pressure in the reaction chamber is in the range of 150-300 mTorr.

25. The method according to claim 1, wherein, during the pre-exposure interval, the partial pressure of the first reactant in the reaction chamber is at least 25 mTorr.

26. The method according to claim 1, wherein the film thickness uniformity across a surface of the deposited film is less than 3.5%.

27. The method according to claim 1, wherein the film thickness uniformity across a surface of the deposited film is less than 2%.

* * * * *